(12) United States Patent
Oh

(10) Patent No.: US 7,576,482 B2
(45) Date of Patent: Aug. 18, 2009

(54) FLAT PANEL DISPLAY DEVICE COMPRISING AN ELECTRICALLY CONDUCTIVE LAYER BETWEEN A DISPLAY AREA AND AN OUTER AREA AND METHOD OF MANUFACTURING THE SAME

(75) Inventor: Sang-Hun Oh, Suwon-si (KR)

(73) Assignee: Samsung Mobile Display Co., Ltd., Gyeonggi-do (KR)

( * ) Notice: Subject to any disclaimer, the term of this patent is extended or adjusted under 35 U.S.C. 154(b) by 32 days.

(21) Appl. No.: 11/488,433

(22) Filed: Jul. 17, 2006

(65) Prior Publication Data

US 2007/0024181 A1 Feb. 1, 2007

(30) Foreign Application Priority Data

Jul. 30, 2005 (KR) .................. 10-2005-0070054

(51) Int. Cl.
*H01L 21/302* (2006.01)
*H01L 51/00* (2006.01)
*H01L 21/461* (2006.01)

(52) U.S. Cl. .................. 313/500; 313/506; 313/507; 257/59

(58) Field of Classification Search ......... 313/500–512, 313/495–497; 438/60; 445/24–25
See application file for complete search history.

(56) References Cited

U.S. PATENT DOCUMENTS

| 6,011,608 | A | 1/2000 | Tanaka |
| 6,157,127 | A | 12/2000 | Hosokawa et al. |
| 6,836,069 | B2 | 12/2004 | Iga |
| 6,836,301 | B1 | 12/2004 | Kohtaka et al. |
| 2002/0014628 | A1* | 2/2002 | Koyama ................ 257/72 |
| 2002/0101399 | A1* | 8/2002 | Kubo et al. ............. 345/104 |
| 2002/0102776 | A1* | 8/2002 | Yamazaki et al. ....... 438/149 |
| 2003/0128322 | A1 | 7/2003 | Kurahashi et al. |
| 2003/0137325 | A1* | 7/2003 | Yamazaki et al. ....... 327/80 |
| 2003/0186489 | A1* | 10/2003 | Ishikawa ............... 438/155 |

(Continued)

FOREIGN PATENT DOCUMENTS

EP 1 369 924 A 12/2003

(Continued)

OTHER PUBLICATIONS

European Search Report dated Oct. 22, 2007 in counterpart European Application No. 06117963.6.

(Continued)

*Primary Examiner*—Sikha Roy
*Assistant Examiner*—Tracie Y Green
(74) *Attorney, Agent, or Firm*—Knobbe Martens Olson & Bear LLP

(57) ABSTRACT

Disclosed is a flat display device which prevents electrode disconnection due to step differences between regions of a display panel. The flat display device includes: a substrate; a plurality of thin film transistors being located in a first region of the substrate; a wire unit located on the substrate and separated from the first region; a conductive layer located on the substrate between the first region and the wire unit; and a plurality of display elements electrically connected to the thin film transistors in the first region.

25 Claims, 9 Drawing Sheets

U.S. PATENT DOCUMENTS

| | | |
|---|---|---|
| 2003/0193056 A1* | 10/2003 | Takayama et al. ............. 257/79 |
| 2003/0205968 A1* | 11/2003 | Chae et al. .................. 313/500 |
| 2004/0012028 A1* | 1/2004 | Park et al. ..................... 257/88 |
| 2004/0026740 A1* | 2/2004 | Kawasaki et al. ........... 257/350 |
| 2004/0108809 A1 | 6/2004 | Heo et al. |
| 2004/0171182 A1* | 9/2004 | Yamazaki et al. ............. 438/22 |
| 2004/0195959 A1* | 10/2004 | Park et al. ................... 313/500 |
| 2004/0219696 A1* | 11/2004 | Seo et al. ...................... 438/20 |
| 2004/0224456 A1 | 11/2004 | Abe |
| 2005/0078263 A1* | 4/2005 | Kim et al. ................... 349/144 |
| 2005/0231085 A1* | 10/2005 | Song et al. .................. 313/110 |

FOREIGN PATENT DOCUMENTS

| | | |
|---|---|---|
| JP | 2000-123978 | 4/2000 |
| JP | 2000-357584 | 12/2000 |
| JP | 2001-059971 | 3/2001 |
| JP | 2002-040431 A | 2/2002 |
| JP | 2002-324666 | 11/2002 |
| JP | 2002-333641 | 11/2002 |
| JP | 2002-367782 | 12/2002 |
| JP | 2003-021844 A | 1/2003 |
| JP | 2003-108029 | 4/2003 |
| JP | 2003-157971 | 5/2003 |
| JP | 2003-177417 | 6/2003 |
| JP | 2003-271075 | 9/2003 |
| JP | 2004-004663 | 1/2004 |
| JP | 2004-296303 | 10/2004 |
| JP | 2004-335267 | 11/2004 |
| JP | 2005-164818 | 6/2005 |
| JP | 2006-054111 | 2/2006 |
| KR | 10-2002-0089978 A | 11/2002 |
| KR | 10-2005-0051076 | 6/2005 |
| KR | 10-2006-0002668 | 1/2006 |

OTHER PUBLICATIONS

Japanese Office Action issued Jan. 27, 2009 in the counterpart Japanese Patent Application No. 2006-172804.

Office Action dated Feb. 23, 2009 in U.S. Appl. No. 11/650,379, filed Jan. 5, 2007.

* cited by examiner

FLAT PANEL DISPLAY DEVICE COMPRISING AN ELECTRICALLY CONDUCTIVE LAYER BETWEEN A DISPLAY AREA AND AN OUTER AREA AND METHOD OF MANUFACTURING THE SAME

CROSS-REFERENCE TO RELATED APPLICATIONS

This application claims the benefit of Korean Patent Application No. 10-2005-0070054, filed on Jul. 30, 2005, in the Korean Intellectual Property Office, the disclosure of which is incorporated herein in its entirety by reference.

BACKGROUND OF THE INVENTION

1. Field of the Invention

The present invention relates to a flat panel display device, and more particularly, to a flat panel display device that can prevent electrode disconnection due to a step difference between display and peripheral regions.

2. Description of the Related Technology

FIG. 1 is a plan view of a typical organic light emitting display device, and FIG. 2 is a cross-sectional view of the organic light emitting display device, taken along the line II-II of FIG. 1.

As depicted in FIGS. 1 and 2, the organic light emitting display device includes a substrate 10 which includes a display region 20, a peripheral region surrounding the display region 20, and a terminal region 70 outside the peripheral region. The display device further includes a sealing member which is configured to enclose the display region 20 and the peripheral region. The sealing member includes a metal cap 90 and a sealant 81.

The display region 20 includes a plurality of display pixels arranged in a matrix form and a plurality of driving lines VDD 31 connected to the pixels. The display pixels include thin film transistors and organic light emitting devices or diodes (not shown). The peripheral region includes an electrode wire unit 41, a driving power wire unit 30, a vertical circuit unit 50 and a horizontal circuit unit 60. The terminal region 70 includes electrodes via which power and input signals are supplied from external devices.

The display device further includes a facing electrode 40 which electrically connects the organic light emitting devices to the electrode wire unit 41. The electrode wire unit 41 is electrically connected to the electrodes in the terminal region 70. In addition, the plurality of driving lines VDD 31 in the display region 20 are electrically connected to the electrodes of the terminal region 70 via the driving power wire unit 30. The driving lines VDD 31 supply driving power to the display region 20. The vertical circuit unit 50 and the horizontal circuit unit 60 are electrically connected to the electrodes in the terminal region 70 via the circuit wire units 51 and 61, respectively. The circuit units 50 and 60 supply input signals to the thin film transistors in the display region 20.

In the structure described above, a plurality of thin film transistors are included in the display region 20, the vertical circuit unit 50, and the horizontal circuit unit 60. A protection or passivation layer is formed over the thin film transistors for protecting the transistors and for providing a horizontally planar surface over the transistors. The protection or passivation layer is formed in one body, covering the display and peripheral regions of the substrate 10. The protection or passivation layer is typically a composite film formed of organic and inorganic materials.

Typically, the protection or passivation layer generates a gas which is detrimental to certain display device elements, such as the organic light emitting devices in the display region 20. In addition, impurities tend to penetrate into the display region 20 through the protection or passivation layer, thereby further degrading display device elements in the display region 20.

SUMMARY OF CERTAIN INVENTIVE ASPECTS

One aspect of the invention provides a flat panel display device. The device comprises: a substrate with a surface comprising a first region, a second region and a third region between the first and second regions of the surface; a first structure over the first region, the first structure comprising a first passivation layer and an array of pixels over the first passivation layer; a second structure over the second region, the second structure comprising a power supply line; a third structure over the third region, the third structure comprising a first electrically conductive layer; and a facing electrode over the first, second and third structures, the facing electrode contacting the power supply line and the first electrically conductive layer.

The second structure may further comprise a second passivation layer underlying the power supply line. In the display device, a groove is formed along over the third structure between the first and second passivation layers. The first electrically conductive layer may contact and may be interposed between the first and second passivation layer. The third structure may further comprise a third passivation layer between the first electrically conductive layer and the substrate and the third passivation layer contacts at least one of the first and second passivation layers. The third passivation layer may have a thickness, which is substantially smaller than the largest thickness of the first passivation layer.

The first structure may further comprise an array of transistors between the array of pixels and the substrate. The first passivation layer may be located between the array of the transistors and the array of the pixels. One of the transistors may comprise a source, a drain, and a gate electrode, and the first structure may further comprise a source electrode contacting the source and a drain electrode contacting the drain. The first electrically conductive layer may be formed of a material used in at least one of the source electrode, the drain electrode and the gate electrode.

In the display device, one of the transistors may comprise a source, a drain, and a gate electrode, and the first structure may further comprise a source electrode contacting the source and a drain electrode contacting the drain. The first electrically conductive layer may be simultaneously formed with at least one of the source electrode, the drain electrode and the gate electrode.

The third structure may further comprise an insulating layer interposed between the first electrically conductive layer and the substrate. In the display device, one of the transistors may comprise a semiconductor layer overlying the substrate, a gate insulating layer overlying the semiconductor layer, a gate electrode overlying the gate insulating layer, and an interlayer insulating layer overlying the gate electrode, and the insulating layer of the third structure may be formed of a material used in at least one of the gate insulating layer and the interlayer insulating layer.

The third structure may further comprise a second electrically conductive layer interposed between the first electrically conductive layer and the substrate. In the display device, one of the transistors may comprise a source, a drain, and a gate electrode, and the first structure may further comprise a source electrode contacting the source and a drain electrode contacting the drain. The second electrically conductive layer may be formed of a material used in at least one of the source electrode, the drain electrode and the gate electrode.

In the display device, one of the transistors may comprise a source, a drain, and a gate electrode, and the first structure may further comprise a source electrode contacting the source and a drain electrode contacting the drain. The second electrically conductive layer may be simultaneously formed with at least one of the source electrode, the drain electrode and the gate electrode.

The third structure may further comprise an insulating layer interposed between the first and second electrically conductive layers. In the display device, one of the transistors may comprise a semiconductor layer overlying the substrate, a gate insulating layer overlying the semiconductor layer, a gate electrode overlying the gate insulating layer, and an interlayer insulating layer overlying the gate electrode, and the insulating layer of the third structure is formed of a material used in at least one of the gate insulating layer and the interlayer insulating layer.

The third structure does not have a passivation layer. The first passivation layer may be formed of semiconductor or insulator. The facing electrode may be at least one of reflective and substantially transparent with respect to visible light. The facing electrode may comprise an Al layer. The facing electrode may comprise an Al/ITO/Ag layer structure. In the display device, the facing electrode may be substantially continuous over the first, second and third structures, and the facing electrode may be discontinued at one or more positions over the third structure. The array of pixels may comprise organic light emitting diodes.

Another aspect of the invention provides a method of making a display device. The method comprises: providing a substrate with a surface comprising a first region, a second region, and a third region between the first and second regions of the surface; forming a first structure over the first region, the first structure comprising a first passivation layer, an array of pixels over the first passivation layer, and an array of transistors between the passivation layer and the substrate; forming a second structure over the second region, the second structure comprising a power supply line; forming a third structure over the third region, the third structure comprising a first electrically conductive layer; and forming a facing electrode over the first, second and third structures such that the facing electrode contacts the power supply line and the first electrically conductive layer.

In the method, one of the transistors may comprise a source, a drain, and a gate electrode, and the first structure may further comprise a source electrode contacting the source and a drain electrode contacting the drain. The first electrically conductive layer may be simultaneously formed along with at least one of the source, drain and gate electrodes.

The method may further comprise forming an insulating layer between the substrate and the first electrically conductive layer in the third region. One of the transistors may comprise a semiconductor layer overlying the substrate, a gate insulating layer overlying the semiconductor layer, a gate electrode overlying the gate insulating layer, and an interlayer insulating layer overlying the gate electrode, and the insulating layer of the third structure may be simultaneously formed along with at least one of the gate insulating layer and the interlayer insulating layer.

The method may further comprise forming a second electrically conductive layer between the substrate and the first electrically conductive layer in the third region. One of the transistors may comprise a source, a drain, and a gate electrode, and the first structure may further comprise a source electrode contacting the source and a drain electrode contacting the drain. The second electrically conductive layer may be simultaneously formed along with at least one of the source, drain and gate electrodes.

The method may further comprise forming an insulating layer between the first electrically conductive layer and the second electrically conductive layer in the third region. One of the transistors may comprise a semiconductor layer overlying the substrate, a gate insulating layer overlying the semiconductor layer, a gate electrode overlying the gate insulating layer, and an interlayer insulating layer overlying the gate electrode, and the insulating layer of the third structure is simultaneously formed along with at least one of the gate insulating layer and the interlayer insulating layer.

The method may further comprise forming a second passivation layer in the second region between the substrate and the power supply line. The first and second passivation layers may be simultaneously formed. Yet another aspect of the invention provides a display device made by the method described above.

Another aspect of the invention provides a flat display device comprising: a substrate; a plurality of thin film transistors being located in a first region of the substrate; a wire unit located on the substrate and separated from the first region; a conductive layer located on the substrate between the first region and the wire unit; and a plurality of display elements electrically connected to the thin film transistors in the first region.

The thin film transistor located in the first region may comprise: a semiconductor layer; a gate insulating film covering the semiconductor layer; a gate electrode located on the gate insulating film; an interlayer insulating layer covering the gate electrode; and a source electrode and a drain electrode, which are located on the interlayer insulating film, and respectively connected to the semiconductor layer through contact holes formed in the gate insulating film and the interlayer insulating film. The gate insulating film and the interlayer insulating film may extend to the outside of the first region, and the wire unit may be located on the interlayer insulating film. The wire unit may be formed of the same material as the source and drain electrodes. The gate insulating film and the interlayer insulating film may extend to the outside of the first region, and the conductive layer may be located on the interlayer insulating film. The conductive layer may be formed of the same material as the source and drain electrodes.

The gate insulating film and the interlayer insulating film may extend to the outside of the first region, and the conductive layer may comprise a first conductive layer located on the gate insulating film and a second conductive layer located on the interlayer insulating film. The first conductive layer may be formed of the same material as the gate electrode and the second conductive layer may be formed of the same material as the source and drain electrodes. The flat display device may further comprise a first region passivation layer covering the first region and a peripheral region passivation layer separated from the first region protection film. The wire unit may be located on the peripheral region protection film.

The display element may be an organic light emitting device that comprises a pixel electrode, a facing electrode, and an intermediate layer which is interposed between the pixel electrode and the facing electrode and comprises at least a light emitting layer. The pixel electrode may be located on the first region passivation layer and electrically connected to the thin film transistors in the first region through a contact hole formed in the first region protection film. The wire unit may be located on the peripheral region passivation layer and formed of the same material as the pixel electrode. The flat display device may further comprise a pixel defining film located on the first region passivation layer to expose the pixel electrode.

The pixel defining film may also be located on the peripheral region protection film. The pixel defining film may comprise a contact hole that exposes at least a portion of the wire unit. The facing electrode may be electrically connected to the wire unit through the contact hole that exposes at least a portion of the wire unit. The facing electrode and the conductive layer may be electrically connected to each other.

BRIEF DESCRIPTION OF THE DRAWINGS

The above and other features and advantages of the present invention will become more apparent and more readily appreciated from the following description, taken in conjunction with the accompanying drawings.

DETAILED DESCRIPTION OF CERTAIN INVENTIVE EMBODIMENTS

Figure 1:
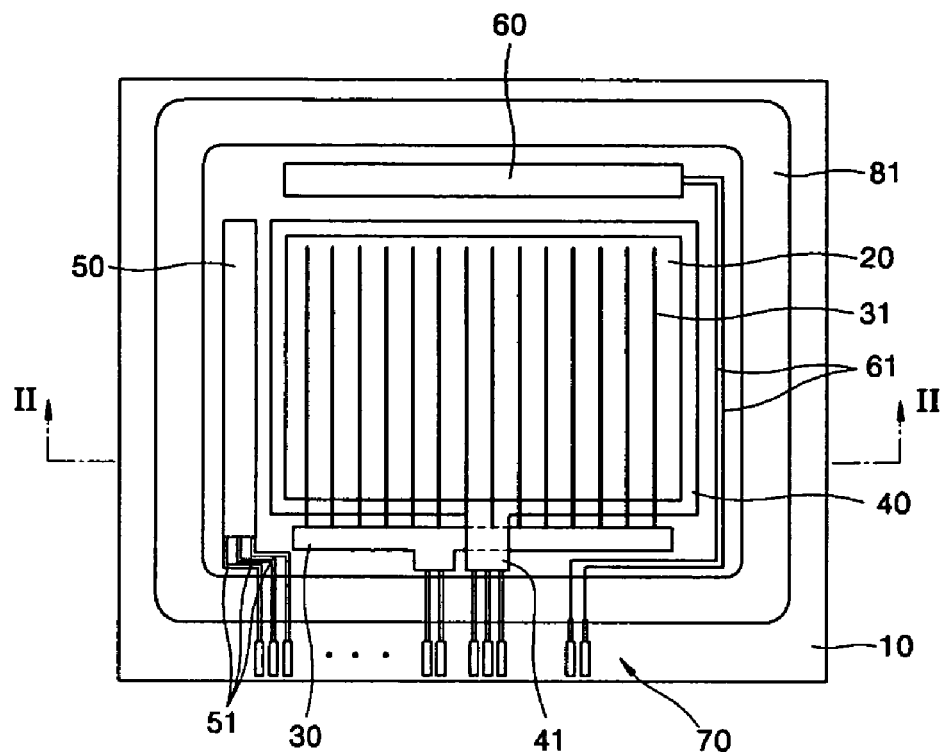
FIG. 1 is a plan view of a conventional organic light emitting display device.
Figure 2:
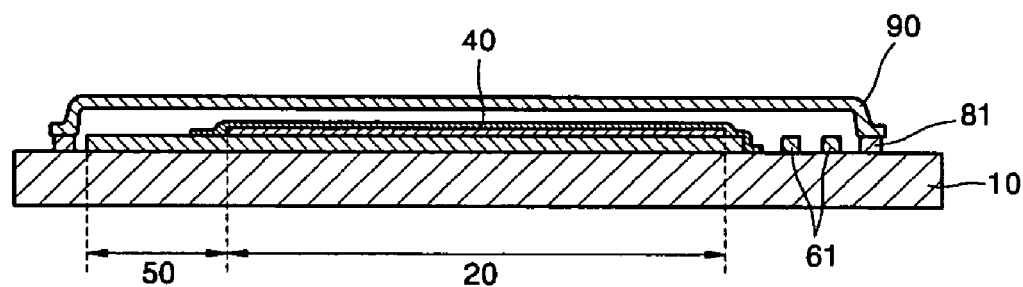
FIG. 2 is a cross-sectional view of the organic light emitting display device of FIG. 1, taken along the line II-II of FIG. 1.

A flat panel display device and a method of making the same according to embodiments of the invention will be described in detail with reference to the accompanying drawings. In the drawings, like reference numerals indicate identical or functionally similar elements.

Figure 3:
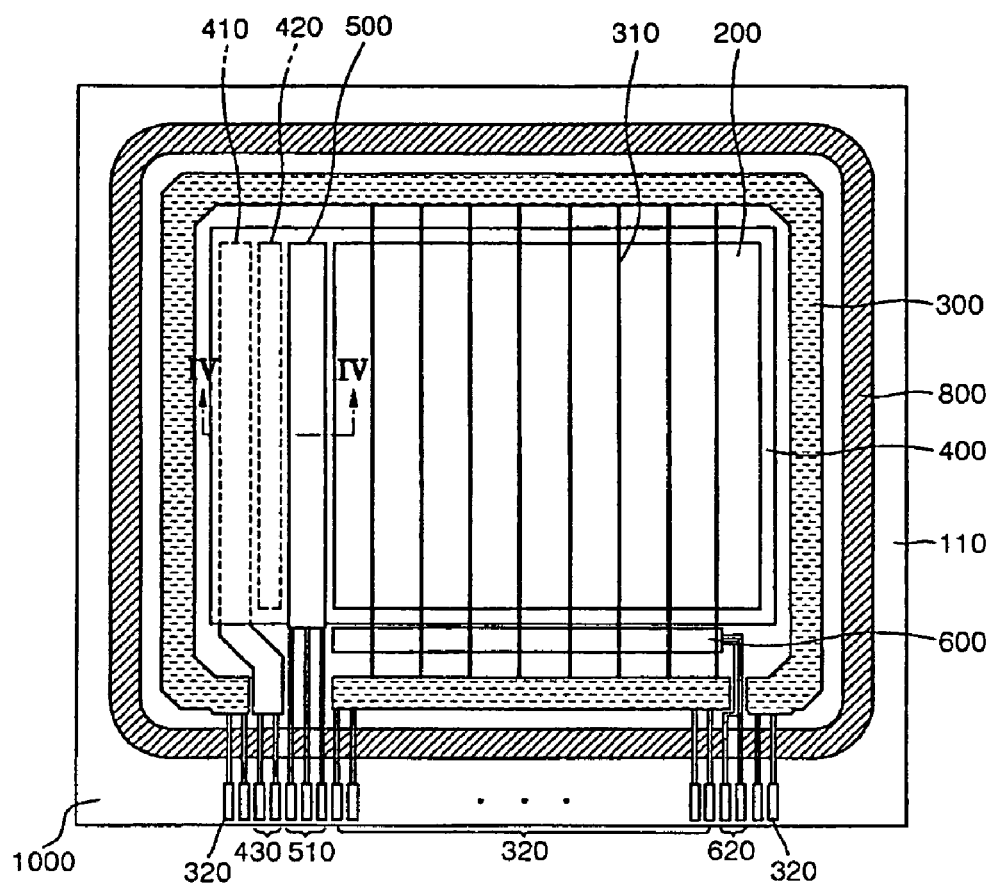
FIG. 3 is a plan view illustrating one embodiment of an organic light emitting display device.
Figure 4:
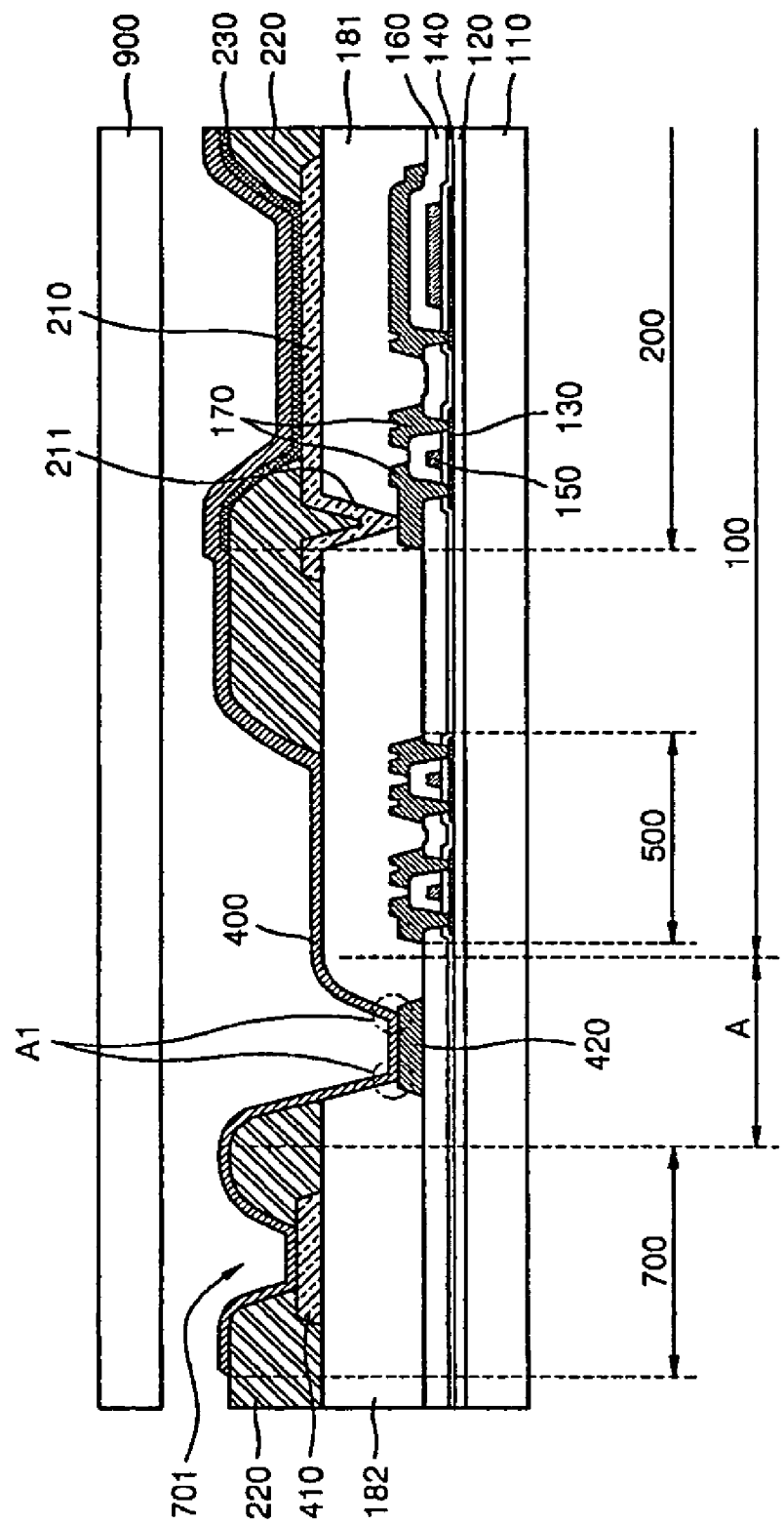
FIG. 4 is a cross-sectional view of the organic light emitting display device of FIG. 3, taken along the line IV-IV of FIG. 3.

FIG. 3 is a plan view of a flat panel display device according to an embodiment, and FIG. 4 is a cross-sectional view thereof, taken along the line IV-IV of FIG. 3. The illustrated flat panel display device is an organic light emitting display device. In other embodiments, the flat panel display device may include other types of display devices such as a liquid crystal display (LCD), a field emission display (FED), and a plasma display panel (PDP).

Referring to FIGS. 3 and 4, the organic light emitting display device includes a substrate 110 which includes a first region 100, a second region 700, and a third region A. The third region is interposed between the first region 100 and the second region 700. The substrate 110 is formed of glass, metal, or plastic. A plurality of thin film transistors are formed in the first region 100 (FIG. 4) of the substrate 110. A wire unit 701 (FIG. 4) is formed in the second region 700 of the substrate 110 outside the first region 100. In addition, a conductive layer 420 is formed in the third region A of the substrate 110.

In addition, the organic light emitting display device includes organic light emitting devices, e.g., organic light emitting diodes. Each of the organic light emitting devices includes a pixel electrode 210 (FIG. 4), a facing electrode 400 facing the pixel electrode 210, and an intermediate layer 230 (FIG. 4) interposed between the pixel electrode 210 and the facing electrode 400. In addition, each of the organic light emitting devices includes a light emitting layer. In a top-emission type display device, the facing electrode may be substantially transparent, and may include a thin Al layer, an ITO layer overlying the Al layer, and an Ag layer overlying the ITO layer.

A plurality of thin film transistors are formed in the first region 100. As shown in FIG. 3, the thin film transistors can be formed in a display region 200 and a vertical circuit driving unit 500. In certain embodiments, other regions of the substrate 110, e.g., a horizontal circuit driving unit 600, may also include thin film transistors.

Terminals 320, 430, 510, and 620 are formed in a terminal region 1000 of the substrate 110. The terminal region 1000 refers to an outermost edge region of the substrate 110, surrounding the second region 700. The terminals are electrically connected to a driving power wire unit 300, an electrode power supply line 410, the vertical circuit driving unit 500, and the horizontal circuit driving unit 600.

In addition, a sealing member 800 and a sealing substrate 900 are configured to enclose the first, second, and third regions, separating these regions from the terminal region 1000 (FIG. 4).

Configurations of the first region 100 will now be described in detail. First, a buffer layer 120 is formed on the substrate 110. In one embodiment, the buffer layer is formed of $SiO_2$. A semiconductor layer 130 is formed and patterned over the buffer layer 120. The semiconductor layer 130 may be formed of amorphous silicon, polycrystalline silicon, or an organic semiconductor material. Although not shown in detail, the semiconductor layer 130 includes a source region, a drain region, and a channel region doped with an N-type dopant or a P-type dopant.

A gate insulating layer 140 is formed over the semiconductor layer 130. The gate insulating layer 140 may be formed of $SiO_2$. It may be deposited by plasma enhanced chemical vapor deposition (PECVD). In addition, a gate electrode 150 is formed over the gate insulating layer 140. The gate electrode 150 is formed of a conductor such as Mo, W or Al/Cu in consideration of adhesiveness with adjacent layers, surface planarity, and processability.

An interlayer insulating film 160 is formed over the gate electrode 150. The interlayer insulating film 160 may have a single layer or multiple layers. The film 160 may be formed of $SiO_2$ or SiNx. Source and drain electrodes 170 are formed over the interlayer insulating film 160. Each of the source and drain electrodes 170 is electrically connected to the semiconductor layer 130 through contact holes formed in the interlayer insulating film 160 and the gate insulating layer 140.

A first region passivation layer 181 is formed over the source and drain electrodes 170. The passivation layer 181 may also serve as a protection and/or planarizing layer. The passivation layer 181 is configured to protect the thin film transistors and provide a planar surface over the thin film transistors. The first region passivation layer 181 can be formed in various configurations and of various materials, including semiconductor and insulator. In one embodiment, the passivation layer 181 is formed of an organic material such as benzocyclobutene (BCB) or acryl. In other embodiments, the film 181 may be formed of an inorganic material such as SiNx. The passivation layer 181 may have a single-layer, double-layer, or multiple-layer structure.

Various display elements can be formed over the first region passivation layer 181. In the illustrated embodiment, an organic light emitting element is formed over the first region passivation layer 181. The organic light emitting element includes the pixel electrode 210, the facing electrode 400 facing the pixel electrode 210, and the intermediate layer 230 interposed between the electrodes 210, 400. The organic light emitting element also includes a light emitting layer.

The pixel electrode 210 is formed over the first region passivation layer 181. The pixel electrode 210 is electrically connected to the source and drain electrodes 170 through a contact hole 211 penetrating the first region passivation layer 181. The pixel electrode 210 can be formed as a transparent or reflective electrode. In an embodiment where the pixel electrode 210 is formed as a transparent electrode, the pixel electrode 210 may be formed of ITO, IZO, ZnO or $In_2O_3$. In other embodiments where the pixel electrode 210 is formed as a reflective electrode, the pixel electrode 210 may include a layer of ITO, IZO, ZnO or $In_2O_3$ and a reflection film underlying the layer. The reflection film may be formed of Ag, Mg, Al, Pt, Pd, Au, Ni, Nd, Ir, Cr, or a metal compound of the foregoing.

The facing electrode 400 may also be formed as a transparent electrode or a reflective electrode. In an embodiment where the facing electrode 400 is formed as a transparent electrode, the facing electrode 400 may have a metal layer with a low work function and an auxiliary electrode layer (or a bus electrode line) overlying the metal layer. The metal layer may be formed of Li, Ca, LiF/Ca, LiF/Al, Al, Ag, Mg, or a metal compound of the foregoing. The auxiliary electrode layer may be formed of a material used for forming the transparent electrode, such as ITO, IZO, ZnO or $In_2O_3$. In other embodiments where the facing electrode 400 is formed as a reflection electrode, the facing electrode 400 only has a layer formed of Li, Ca, LiF/Ca, LiF/Al, Al, Ag, Mg, or a metal compound of the foregoing. In certain embodiments, the pixel electrode 210 and the facing electrode 400 may be formed of an organic material such as a conductive polymer.

The intermediate layer 230 may be formed of a low molecular weight organic material or a polymeric organic material. In an embodiment where the intermediate layer 230 is formed of a low molecule organic material, the intermediate layer 230 can be formed in a single layer structure. The intermediate layer 230 may also be formed in a multi-layered structure by stacking a Hole Injection Layer (HIL), a Hole Transport Layer (HTL), an Emission Layer (EML), an Electron Transport Layer (ETL), and an Electron Injection Layer (EIL). Examples of organic materials for the intermediate layer 230 include, but are not limited to, copper phthalocyanine (CuPc), N,N'-Di(naphthalene-1-yl)-N,N'-diphenyl-benzidine (NPB), and tris-8-hydroxyquinoline aluminum (Alq3). The low molecule organic layer can be formed by an evaporation method.

In other embodiments where the intermediate layer 230 is formed of a polymer organic material, the intermediate layer 230 can include an HTL and an EML. In this embodiment, the HTL may be formed of a polymer such as poly-(2,4)-ethylene-dihydroxy thiophene (PEDOT). The light emitting layer may be formed of poly-phenylenevinylene (PPV) and polyfluorene group polymers. These layers may be formed using a screen printing or an inkjet printing method. A skilled artisan will appreciate that various configurations and materials can be used for the intermediate layer 230.

The wire unit 701 is located in the second region 700 outside the first region 100. As shown in FIG. 4, the wire unit 701 includes the electrode power supply line 410. The wire unit 701 is electrically connected to the facing electrode 400 to supply power to the facing electrode 400. In the illustrated embodiment, the gate insulating layer 140 and the interlayer insulating film 160 extend from the first region 100 to the second region 700. In other embodiments, the gate insulating layer 140 and the interlayer insulating film 160 may not extend outside of the first region 100.

The organic light emitting device also requires other power sources such as a driving power source. Driving power may be supplied via the plurality of driving lines (VDD) 310 in the display region 200. The driving lines 310 are electrically connected to the driving power wire unit 300 which is positioned outside the display region 200. In the illustrated embodiment, the driving power wire unit 300 is configured to surround the display region 200. In other embodiments, the driving power wire unit may have a different shape and may not surround the display region 200.

As shown in FIG. 4, the first region passivation layer 181 is configured to cover the first region 100. In addition, a second or peripheral region passivation layer 182 may be formed in the second region 700 outside the first region 100. The peripheral region passivation layer 182 can be provided by first forming a passivation layer over the first, second, and third regions of the substrate 110, and removing the passivation layer from the third region A. In another embodiment, the passivation layers 181 and 182 may be formed individually while not forming a layer over the third region A.

The passivation layer may be a composite film formed of organic and/or inorganic materials. As explained above, in the conventional display device, because the passivation layer is formed in one body over the display and peripheral regions of the substrate, impurities may diffuse from outside through the passivation layer in the peripheral region into the display region 200.

In the illustrated embodiment, however, the passivation layer is discontinued between the first region 100 and the second (or peripheral) region 700. Thus, impurities cannot diffuse from the second region 700 into the first region 100. Thus, impurities cannot reach into the display region 100 even though the impurities have penetrated into the peripheral region passivation layer 182 from the outside. In this manner, the lifetime of the display device can be increased. In addition, degradation of image quality after a prolonged operation can be prevented. In certain embodiments, a thin passivation layer may be provided in the third region A. The thin passivation layer has a thickness substantially thinner than the thicknesses of the passivation layers 181 and 182 in the first and second regions 100 and 700. In the illustrated embodiment, a conductive layer 420, of which the function will be described later, is positioned between the passivation layers of the first region 100 and the second region 700.

As shown in FIG. 4, the wire unit 701, including the electrode power supply line 410, is positioned on the second region passivation layer 182. In the illustrated embodiment, the electrode power supply line 410 may be simultaneously formed with the pixel electrode 210 in the display region 200. The electrode power supply line 410 may be formed of the same material as the pixel electrode 210. In certain embodiments, the power supply line 410 may be formed of a material different from that of the pixel electrode 210.

In addition, a pixel defining film 220 is formed over the pixel electrode 210 and the passivation layer 181 in the first region 100. The pixel defining film 220 is configured to define pixels by having an opening for each sub-pixel. The opening is configured to expose the pixel electrode 210, and prevents arc from occurring at an end portion of the pixel electrode 210 by increasing a distance between end portions of the pixel electrode 210 and the facing electrode 400. The pixel defining film 220 can also be formed on the second (or peripheral) region passivation layer 182 in the second region 700. In the illustrated embodiment, the pixel defining film 220 has a contact hole or recess which exposes at least a portion of a top surface of the electrode power supply line 410. The electrode power supply line 410 and the facing electrode 400 are electrically connected through the contact hole.

In the illustrated embodiment, the facing electrode 400 is formed across the first, second, and third regions of the substrate 110. As shown in FIG. 4, because the passivation layer has been removed from the third region A to discontinue the passivation layer between the first and second regions, a recess is formed in the third region, exposing a top surface of the conductive layer 420. The facing electrode 400, which is simultaneously formed over the first, second, and third regions in the same thickness, bends downward in contact with exposed surfaces of the recess in the third region A.

Figure 5:
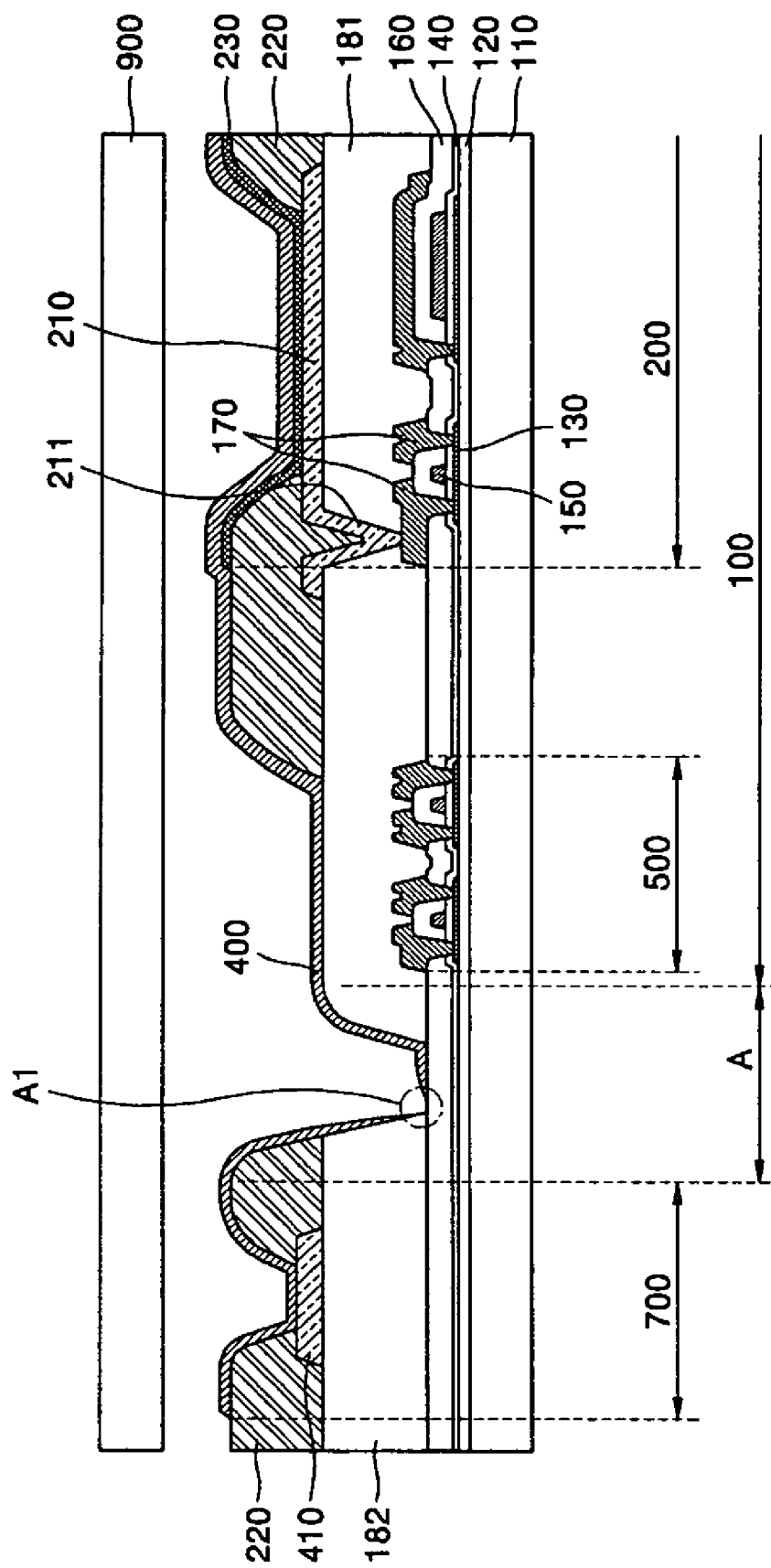
FIG. 5 is a cross-sectional view of an organic light emitting display device having no conductive layer in a third region.

Because the facing electrode 400 has a thin thickness relative to adjacent protection films, it may be disconnected due to step differences, as shown in FIG. 5. The facing electrode 400 has a thickness of approximately 180 Å while the passivation layer and the pixel defining film have a thickness of approximately 2 μm. In the organic light emitting display device of FIG. 5 which has no conductive layer in the third region A, large step differences occur between the third region A and the adjacent regions 100, 700. Because of the step differences, the facing electrode 400 may be disconnected as indicated by Al. In such a case, the wire unit 701 cannot be electrically connected to the facing electrode 400 and thus it is required to reduce the step differences. The conductive layer 420 of FIG. 4 reduces the step differences. This configuration prevents disconnection of the facing electrode 400 which may occur in the third region A.

The conductive layer 420 may be simultaneously formed with the source and drain electrodes 170 in the first region 100. The conductive layer 420 may be formed of the same material as that of the source and drain electrodes 170. In other embodiments, the conductive layer 420 may be formed of a material different from the source and drain electrode material. The conductive layer 420 may have other configurations adapted to the display panel structure.

In this manner, the step differences can be reduced, and thus, disconnection of the facing electrode 400 can be prevented. Also, even if the facing electrode 400 is disconnected, the wire unit 700 and the facing electrode 400 can be connected through the conductive layer 420 as long as the facing electrode 400 is in contact with the conductive layer 420. Therefore, this configuration reduces a product failure rate.

In an unpictured embodiment, the second region 700 does not include a passivation layer over the substrate 110. In this embodiment, the wire unit 701, i.e., the electrode power supply line 410, is formed on the interlayer insulating film 160. The electrode power supply line 410 is formed on the same layer as the source and drain electrodes 170. The electrode power supply line 410 may be formed of the same material as that of the source and drain electrodes 170.

Figure 6:
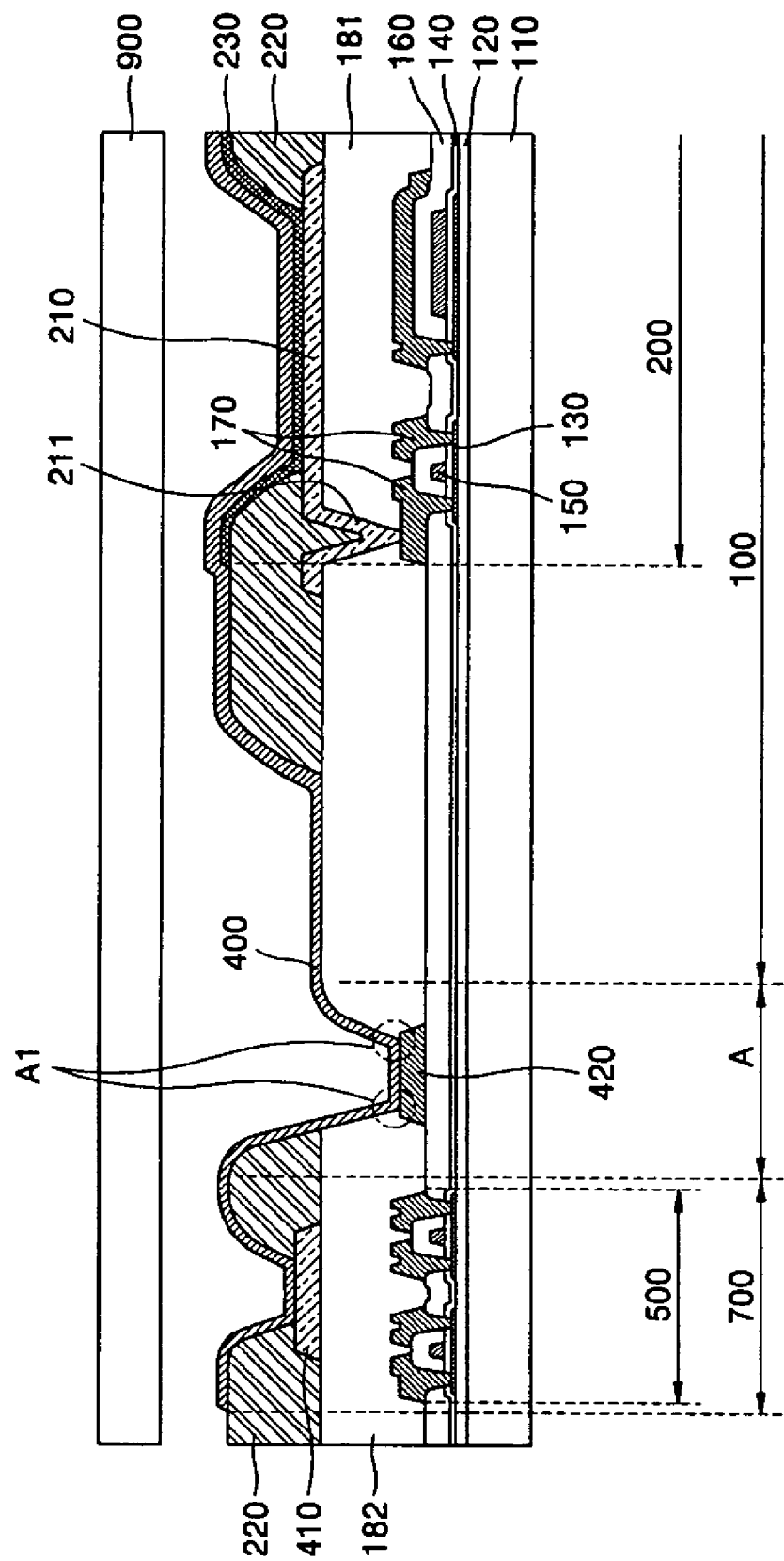
FIG. 6 is a cross-sectional view illustrating another embodiment of an organic light emitting display device.
Figure 7:
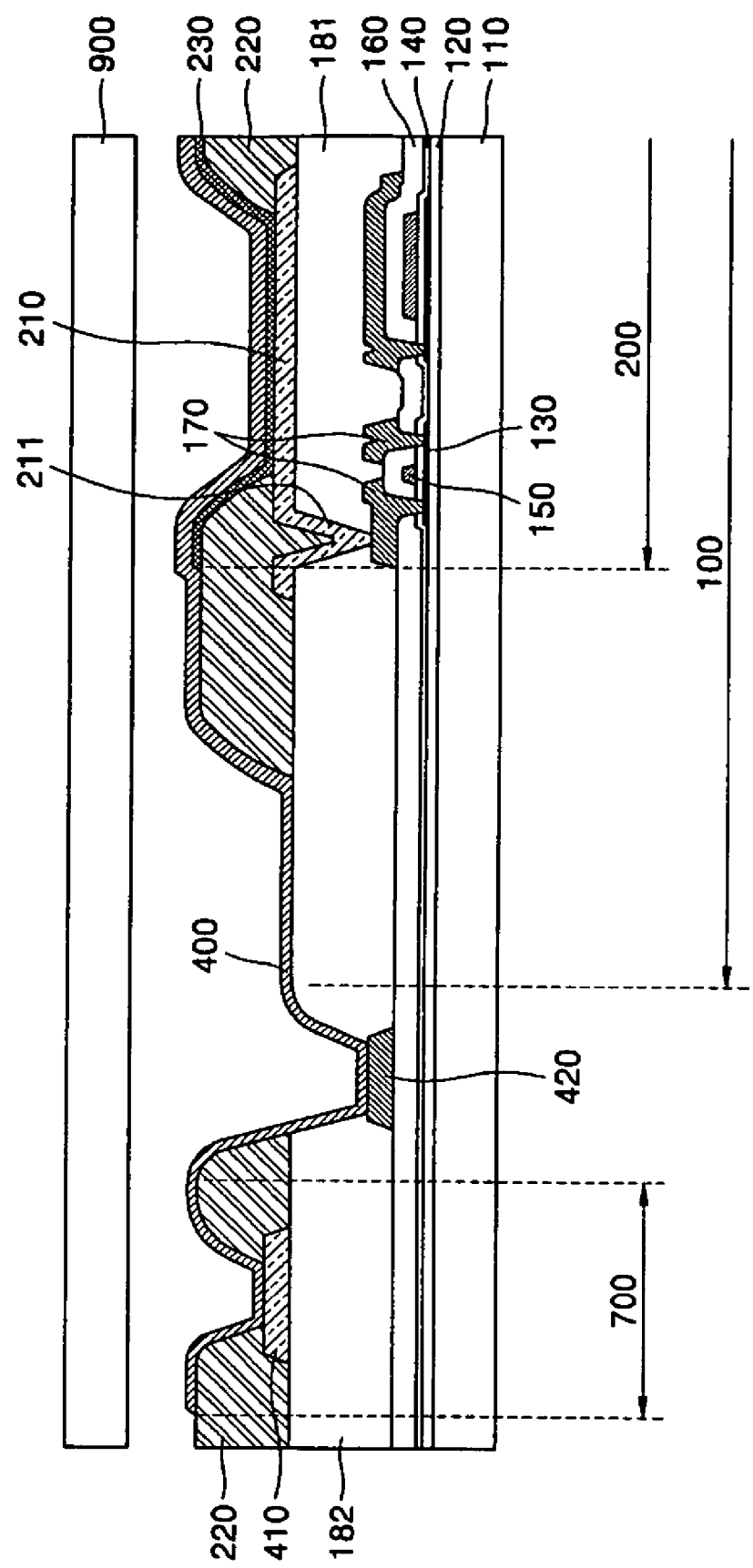
FIG. 7 is a cross-sectional view illustrating yet another embodiment of an organic light emitting display device.
Figure 8:
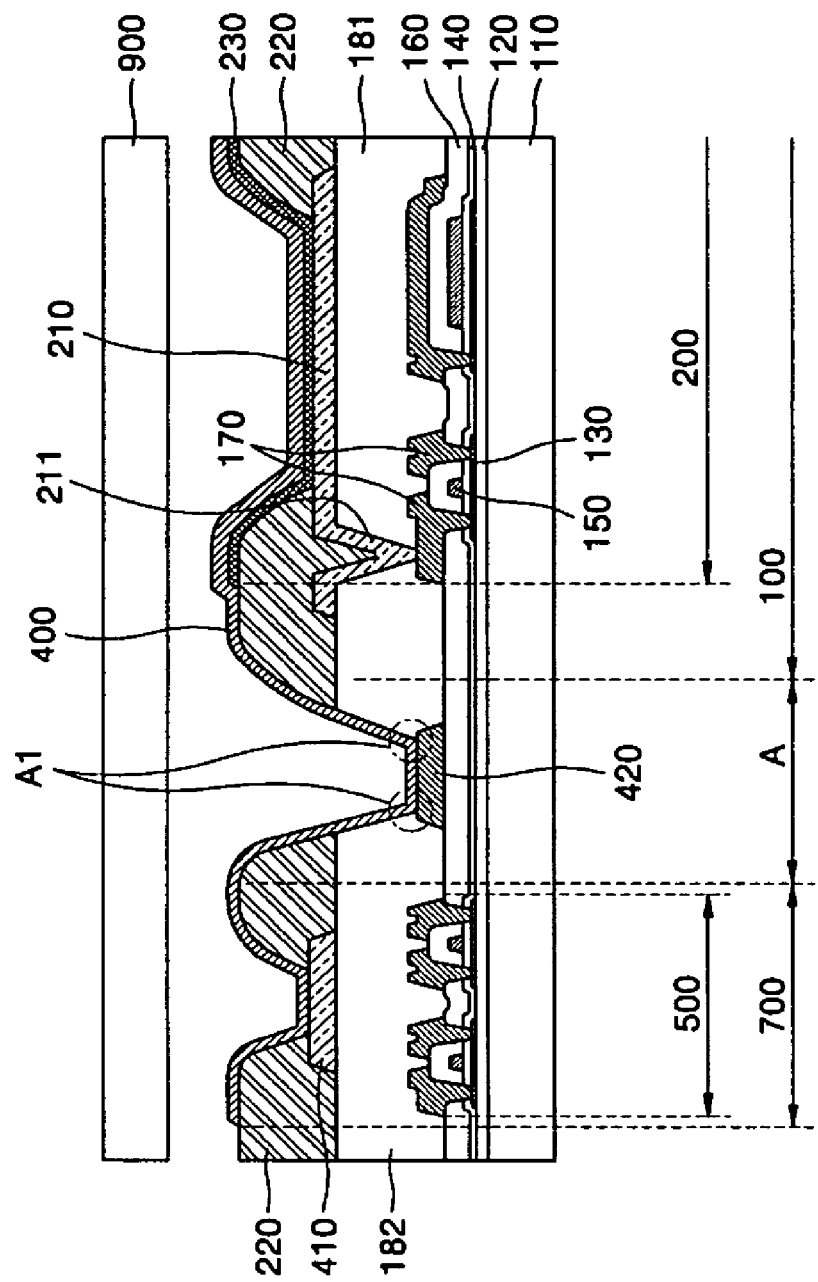
FIG. 8 is a cross-sectional view illustrating still another embodiment of an organic light emitting display device.

In another embodiment shown in FIG. 6, the vertical circuit unit 500 is formed in the second region 700 under the wire unit 701. In yet another embodiment depicted in FIG. 7, the vertical circuit unit (not shown) is positioned outside the second region 700. In yet another embodiment shown in FIG. 8, the vertical circuit unit 500 is located in the second region 700 and a pixel defining film 220 is formed over the passivation layer 181 in the first region adjacent to the third region. In the above embodiments, step differences occur between the third region A and the first region 100 and between the third region A and the second region 700. The conductive layer 420 in the third region A prevents a product failure caused by disconnection of the facing electrode 400 due to the step differences.

Figure 9:
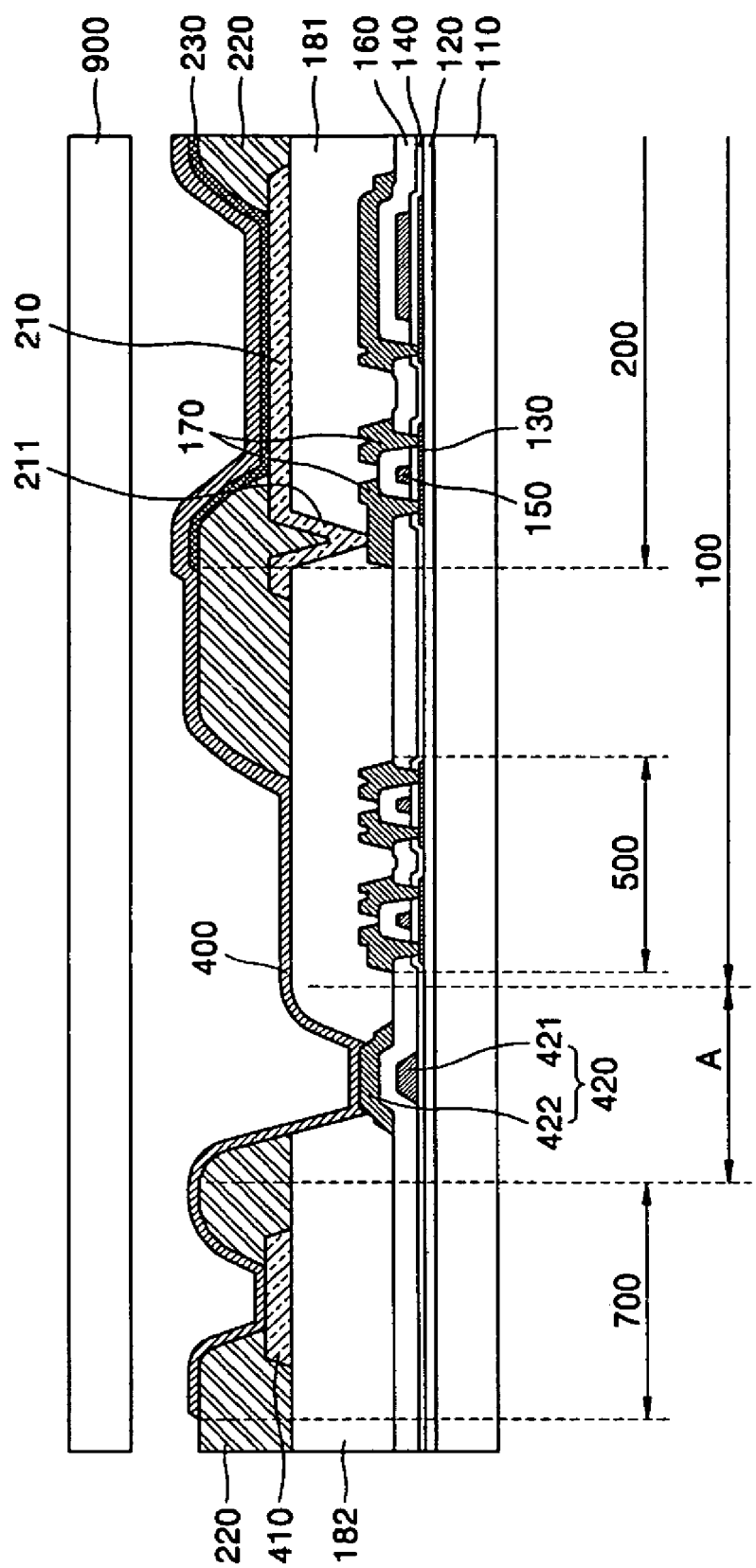
FIG. 9 is a cross-sectional view illustrating another embodiment of an organic light emitting display device.

FIG. 9 is a cross-sectional view of another embodiment of a flat panel display device. The illustrated flat panel display device is an organic light emitting display device.

The illustrated organic light emitting display device has a structure and materials as described above with reference to FIG. 4. In the illustrated device, however, the conductive layer 420 has a double-layered structure with an insulating layer interposed therebetween. The conductive layer 420 includes a first conductive layer 421 and a second conductive layer 422. The first conductive layer 421 may be formed over the gate insulating film 140 simultaneously with the gate electrode 150 in the first region 100. The first conductive layer 421 may be formed of the same material as that of the gate electrode 150. The second conductive layer 422 may be formed over the interlayer insulating film 160 simultaneously with the source and drain electrodes 170. It may be formed of the same material as that of the source and drain electrodes 170. The double-layered structure can further reduce the step differences between the third region and first/second region, thereby further reducing disconnection of the facing electrode 400.

Figure 10:
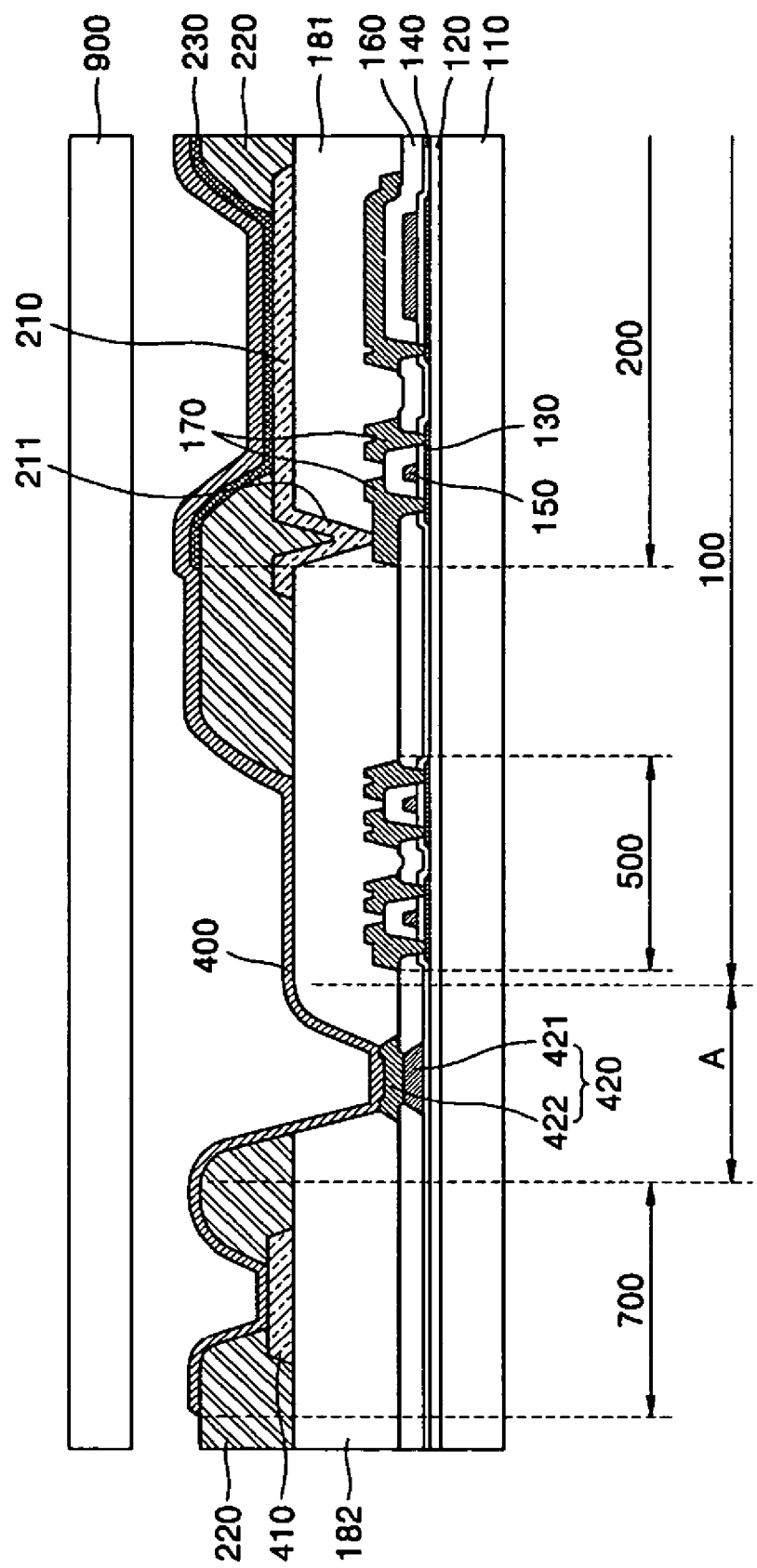
FIG. 10 is a cross-sectional view illustrating yet another embodiment of an organic light emitting display device.

FIG. 10 is a cross-sectional view of yet another embodiment of a flat panel display device. The illustrated flat panel display device is an organic light emitting display device.

The illustrated organic light emitting display device has a structure and materials as described above with reference to FIG. 4. In the illustrated device, however, the conductive layer 420 has a double-layered structure. The conductive layer 420 has two layers, including a first conductive layer 421 and a second conductive layer 422 directly overlying the first conductive layer 421. Electrical connection between the first conductive layer 421 and the second conductive layer 422 can be established by removing the interlayer insulating film 160 from over the first conductive layer 421 when contact holes for connecting the source and drain electrodes 170 to the semiconductor layer 130 in the first region, are formed.

In other embodiments, the above-described configurations may apply to other types of display devices, including, but not limited to, a liquid crystal display (LCD).

Flat display devices according to the embodiments above have the following advantages. First, a passivation layer is discontinued between the first (or display) region and the second (or peripheral) region. Therefore, impurity penetration into the display region through the passivation layer in the peripheral region can be prevented. Second, the conductive layer in the third region can prevent disconnection of electrodes due to the step differences between adjacent layers. Third, since the conductive layer is included between the first region passivation layer and the peripheral region protection film, even if the facing electrode is disconnected due to the step differences, the facing electrode can be electrically connected to the wire unit through the conductive layer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flat panel display device, comprising:
a substrate with a surface including a first region, a second region and a third region between the first and second regions of the surface;
a first structure over the first region, the first structure including a first passivation layer and an array of pixels over the first passivation layer;
a second structure over the second region, the second structure including a second passivation layer and a power supply line over the second passivation layer;
a third structure over the third region, the third structure including a first electrically conductive layer, wherein a groove is defined over the third region between the first and second passivation layers, and physically separates the first passivation layer from the second passivation layer; and
a facing electrode over the first, second and third structures, the facing electrode contacting the power supply line over the second region and the first electrically conductive layer over the third region.

2. The display device of claim 1, wherein the first electrically conductive layer contacts and is interposed between the first and second passivation layer.

3. The display device of claim 1, wherein the third structure further comprises a third passivation layer between the first electrically conductive layer and the substrate, wherein the third passivation layer contacts at least one of the first and second passivation layers, and wherein the third passivation layer has a thickness, which is substantially smaller than the largest thickness of the first passivation layer.

4. The display device of claim 1, wherein the first structure further comprises an array of transistors between the array of pixels and the substrate.

5. The display device of claim 4, wherein the first passivation layer is located between the array of the transistors and the array of the pixels.

6. The display device of claim 4, wherein one of the transistors comprises a source electrode, a drain electrode, and a gate electrode, and wherein the first electrically conductive layer is formed of a material used in at least one of the source electrode, the drain electrode and the gate electrode.

7. The display device of claim 4, wherein one of the transistors comprises a source electrode, a drain electrode, and a gate electrode, and wherein the first electrically conductive layer is simultaneously formed with at least one of the source electrode, the drain electrode and the gate electrode.

8. The display device of claim 4, wherein the third structure further comprises an insulating layer interposed between the first electrically conductive layer and the substrate.

9. The display device of claim 8, wherein one of the transistors comprises a semiconductor layer overlying the substrate, a gate insulating layer overlying the semiconductor layer, a gate electrode overlying the gate insulating layer, and an interlayer insulating layer overlying the gate electrode, and wherein the insulating layer of the third structure is formed of a material used in at least one of the gate insulating layer and the interlayer insulating layer.

10. The display device of claim 4, wherein the third structure further comprises a second electrically conductive layer interposed between the first electrically conductive layer and the substrate.

11. The display device of claim 10, wherein one of the transistors comprises a source electrode, a drain electrode, and a gate electrode, and wherein the second electrically conductive layer is formed of a material used in at least one of the source electrode, the drain electrode and the gate electrode.

12. The display device of claim 10, wherein one of the transistors comprises a source electrode, a drain electrode, and a gate electrode, and wherein the second electrically conductive layer is simultaneously formed with at least one of the source electrode, the drain electrode and the gate electrode.

13. The display device of claim 10, wherein the third structure further comprises an insulating layer interposed between the first and second electrically conductive layers.

14. The display device of claim 13, wherein one of the transistors comprises a semiconductor layer overlying the substrate, a gate insulating layer overlying the semiconductor layer, a gate electrode overlying the gate insulating layer, and an interlayer insulating layer overlying the gate electrode, and wherein the insulating layer of the third structure is formed of a material used in at least one of the gate insulating layer and the interlayer insulating layer.

15. The display device of claim 1, wherein the third structure does not have a passivation layer.

16. The display device of claim 1, wherein the first passivation layer is formed of semiconductor or insulator.

17. The display device of claim 1, wherein the facing electrode is at least one of reflective and substantially transparent with respect to visible light.

18. The display device of claim 17, wherein the facing electrode comprises an Al layer.

19. The display device of claim 18, wherein the facing electrode comprises an Al/ITO/Ag layer structure.

20. The display device of claim 1, wherein the facing electrode is discontinued at one or more positions over the third structure, wherein the facing electrode is continuous over the first, second and third structures except at the one or more positions where the facing electrode is discontinued.

21. The display device of claim 1, wherein the array of pixels comprises organic light emitting diodes, wherein each organic light emitting diode includes a pixel electrode, the facing electrode, and an intermediate layer interposed between the pixel electrode and the facing electrode.

22. The display device of claim 1, wherein the facing electrode contacts the first, second and third structures.

23. The display device of claim 1, wherein the first passivation layer has a first elongated edge, and wherein the second passivation layer has a second elongated edge extending generally along the first elongated edge.

24. The display device of claim 23, wherein the power line extends generally along the second elongated edge.

25. The display device of claim 23, wherein the groove is defined between the first and second elongated edges.

* * * * *

UNITED STATES PATENT AND TRADEMARK OFFICE
CERTIFICATE OF CORRECTION

| | | |
|---|---|---|
| PATENT NO. | : 7,576,482 B2 | Page 1 of 1 |
| APPLICATION NO. | : 11/488433 | |
| DATED | : August 18, 2009 | |
| INVENTOR(S) | : Sang-Hun Oh | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 56 days.

Signed and Sealed this

Seventh Day of September, 2010

David J. Kappos
*Director of the United States Patent and Trademark Office*